(12) United States Patent  
Chu et al.

(10) Patent No.: US 11,836,326 B2  
(45) Date of Patent: Dec. 5, 2023

(54) TOUCH DISPLAY APPARATUS

(71) Applicant: LG Display Co., Ltd., Seoul (KR)

(72) Inventors: Dong Il Chu, Paju-si (KR); Young Kyun Moon, Paju-si (KR); Min Joo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/976,157

(22) Filed: Oct. 28, 2022

(65) Prior Publication Data

US 2023/0214076 A1 Jul. 6, 2023

(30) Foreign Application Priority Data

Dec. 31, 2021 (KR) ........................ 10-2021-0194811

(51) Int. Cl.
| | |
|---|---|
| *G06F 3/044* | (2006.01) |
| *H10K 59/40* | (2023.01) |
| *H10K 59/131* | (2023.01) |
| *H10K 59/122* | (2023.01) |
| *H10K 50/844* | (2023.01) |

(52) U.S. Cl.
CPC ......... *G06F 3/0446* (2019.05); *H10K 50/844* (2023.02); *H10K 59/122* (2023.02); *H10K 59/131* (2023.02); *H10K 59/40* (2023.02); *G06F 2203/04111* (2013.01)

(58) Field of Classification Search
CPC ..... G06F 3/0446; H10K 59/131; H10K 59/40
See application file for complete search history.

(56) References Cited

U.S. PATENT DOCUMENTS

| | | | |
|---|---|---|---|
| 11,073,930 B2* | 7/2021 | Mizuhashi | .......... G06F 3/04184 |
| 2018/0151660 A1 | 5/2018 | Kim et al. | |
| 2019/0341439 A1 | 11/2019 | Choi et al. | |
| 2020/0111987 A1 | 4/2020 | Kim et al. | |
| 2020/0373375 A1 | 11/2020 | Na et al. | |
| 2021/0134928 A1 | 5/2021 | Bang et al. | |
| 2021/0191549 A1* | 6/2021 | Kim | ....................... H10K 50/84 |

OTHER PUBLICATIONS

United Kingdom Intellectual Property Office, Search and Examination Report, United Kingdom Patent Application No. GB2216341.4, dated Apr. 24, 2023, eight pages.

* cited by examiner

*Primary Examiner* — Kevin M Nguyen  
(74) *Attorney, Agent, or Firm* — Fenwick & West LLP

(57) ABSTRACT

A touch display apparatus is provided. The touch display apparatus may include touch electrodes on an encapsulating layer covering light-emitting devices. An auxiliary line crossing a display area in which the light-emitting devices are disposed may be disposed on the encapsulating layer. The auxiliary line may be electrically connected to a power voltage supply line at the outside of the display area. Each of the light-emitting devices may include a first emission electrode, a light-emitting layer and a second emission electrode, which are stacked on an emission area defined by a bank insulating layer. The second emission electrode of each light-emitting device may be electrically connected to the auxiliary line on the bank insulating layer. Thus, in the touch display apparatus, a luminance deviation due to a voltage drop may be prevented or at least reduced.

20 Claims, 8 Drawing Sheets

TOUCH DISPLAY APPARATUS

CROSS-REFERENCE TO RELATED APPLICATION

This application claims the benefit of Republic of Korea Patent Application No. 10-2021-0194811, filed on Dec. 31, 2021, which is hereby incorporated by reference in its entirety.

BACKGROUND

Field of Technology

The present disclosure relates to a touch display apparatus in which touch electrodes are disposed on encapsulating unit covering light-emitting devices.

Discussion of the Related Art

Generally, a display apparatus provides an image to user. For example, the display apparatus may include a plurality of pixel areas. Each of the pixel areas may corresponding to a specific color. For example, a light-emitting device may be disposed in each pixel area. The light-emitting device may emit light displaying a specific color. For example, the light-emitting device may include a first emission electrode, a light-emitting stack, and a second emission electrode, which are sequentially stacked on a device substrate.

The display apparatus may perform a specific program or apply a specific signal by a touch of user and/or a tool. For example, the display apparatus may be a touch display apparatus including a touch sensor. The touch sensor may be disposed on an encapsulating unit covering the light-emitting devices. For example, the touch sensor may include touch electrodes disposed side by side on the encapsulating unit.

In the touch display apparatus, a power voltage supply line supplying a power voltage to the light-emitting devices may be disposed outside a display area in which the light-emitting devices are disposed. Thus, in the touch display apparatus, light emitted from the light-emitting devices disposed in a central region of the display area may have a luminance that is different from light emitted from the light-emitting devices disposed in an edge region of the display area due to a voltage drop.

SUMMARY

Accordingly, the present disclosure is directed to a touch display apparatus that substantially obviates one or more problems due to limitations and disadvantages of the related art.

An object of the present disclosure is to provide a touch display apparatus capable of preventing or at least reducing a luminance deviation due to the voltage drop.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a touch display apparatus comprising a device substrate including a display area and a bezel area; a light-emitting device on the display area, the light-emitting device including a first emission electrode, a light-emitting layer, and a second emission electrode that are sequentially stacked; a first dam on the bezel area, the first dam surrounding the display area; an encapsulating layer on the light-emitting device, the encapsulating layer including an organic encapsulating layer in a region defined by the first dam; a power voltage supply line positioned outside of the first dam, the power voltage supply line extending along an edge of the display area; a touch sensor on the encapsulating layer, the touch sensor including a plurality of touch electrodes; and an auxiliary line electrically connected to the power voltage supply line, the auxiliary line extending on the encapsulating layer in the display area and is connected to the second emission electrode in the display area.

In one embodiment, a touch display apparatus comprising: a substrate including a display area and a bezel area; a plurality of pixels each including a light emitting device comprising a first electrode, a light emitting layer on the first electrode, and a second electrode on the light emitting layer, wherein a second electrode of a first pixel from the plurality of pixels is electrically connected to a second electrode of a second pixel from the plurality of pixels, the second pixel closer to the bezel area than the first pixel such that the second electrode of the second pixel extends from the display area to the bezel area; a power voltage supply line on the bezel area, the power voltage supply line connected to the second electrode of the second pixel to supply a power supply voltage to the second pixel, and the power supply voltage supplied to the second electrode of the first pixel via the second electrode of the first pixel; a touch sensor on the plurality of pixels, the touch sensor including a plurality of touch electrodes; and an auxiliary power line on the display area, the auxiliary power line electrically connected to the power supply voltage and connected to the second electrode of the first pixel and the second electrode of the second pixel in the display area to supply the power supply voltage to the second electrode of the first pixel and the second electrode of the first pixel.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
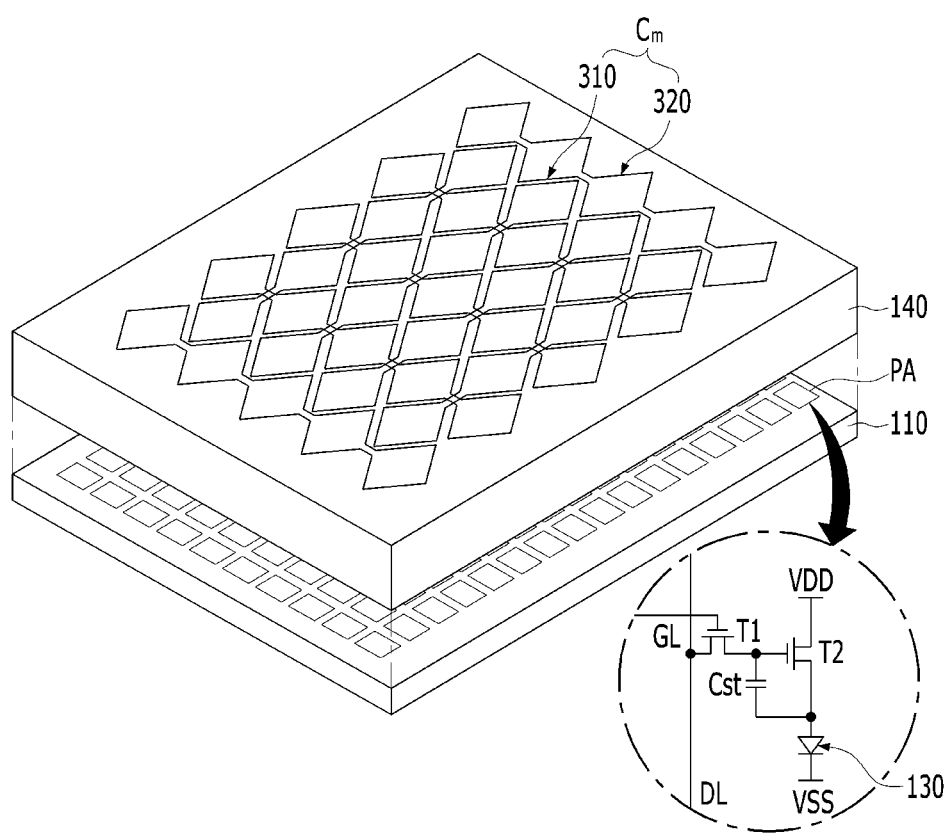
FIGS. 1 and 2 are views schematically showing a touch display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
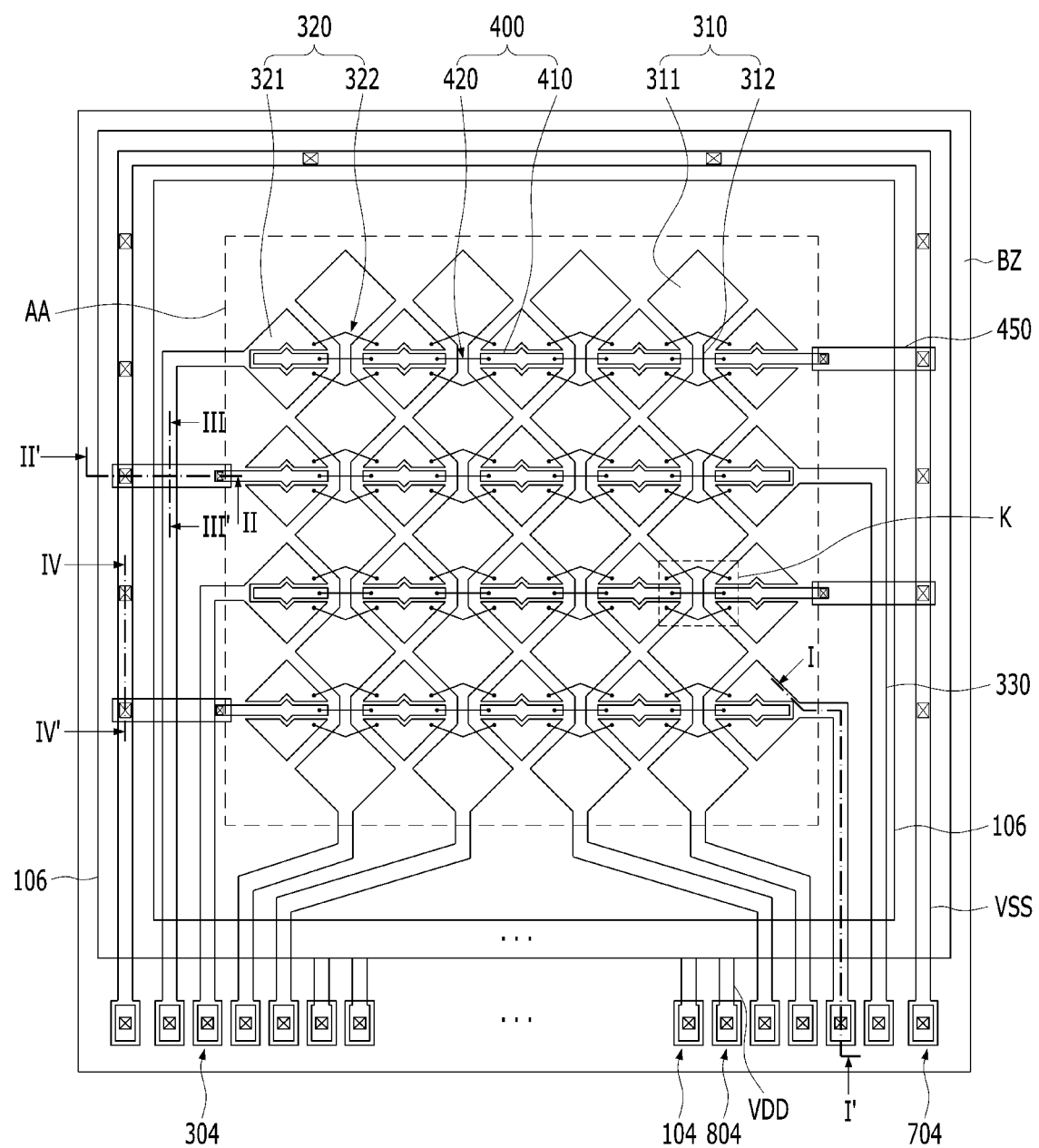
Figure 3:
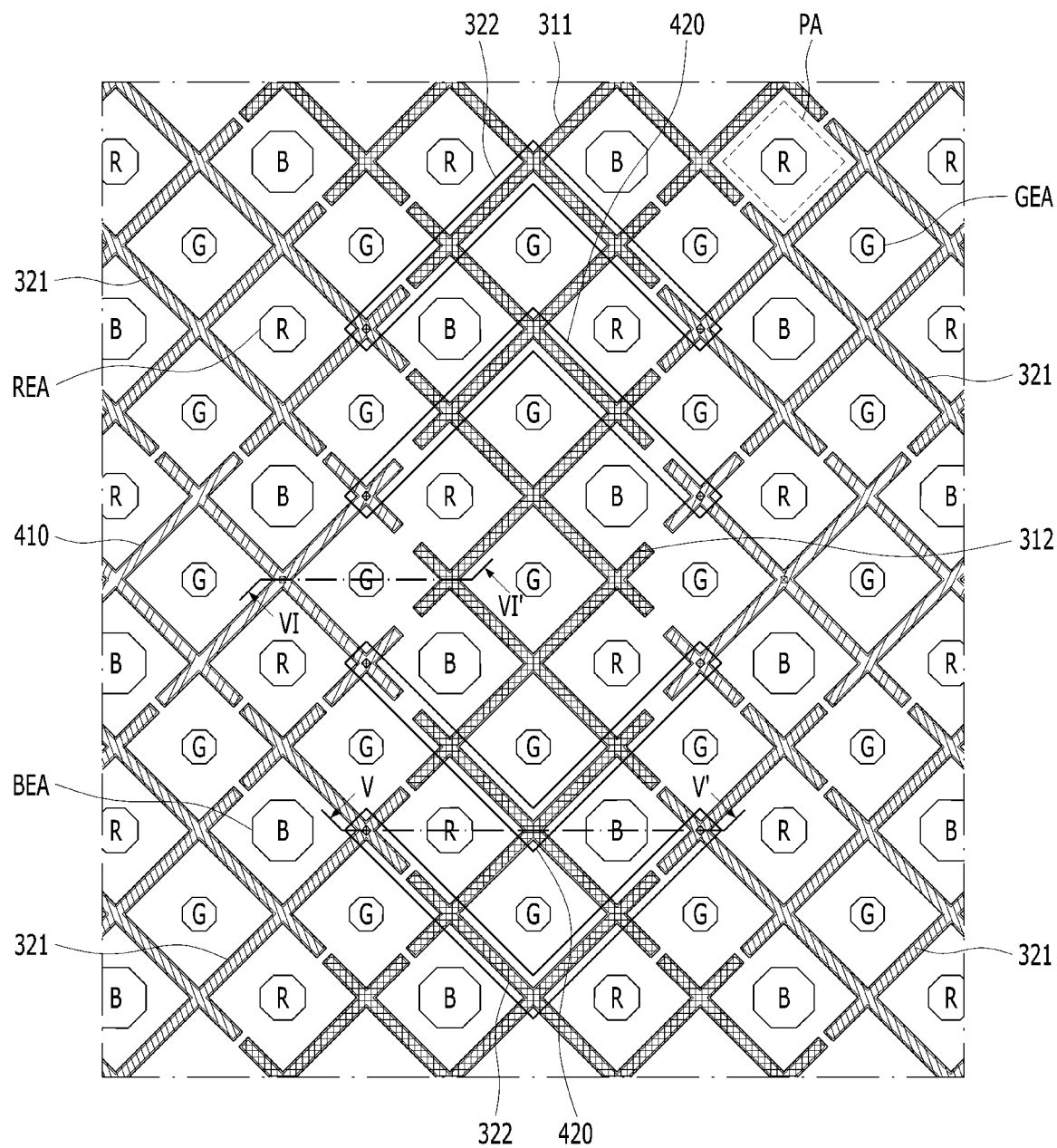
FIG. 3 is an enlarged view of K region in FIG. 2 according to an embodiment of the present disclosure.
Figure 4:
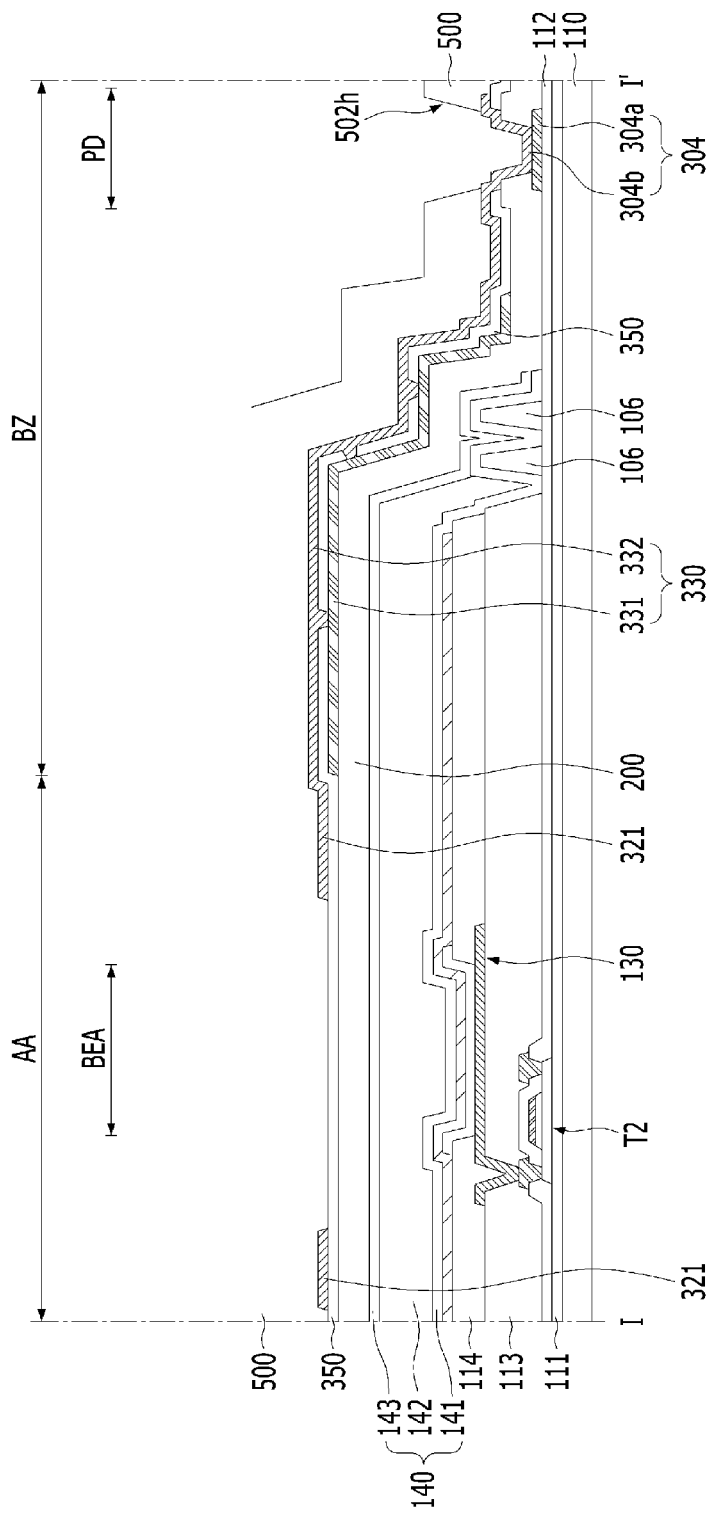
FIG. 4 is a view taken along I-I' of FIG. 2 according to an embodiment of the present disclosure.
Figure 5:
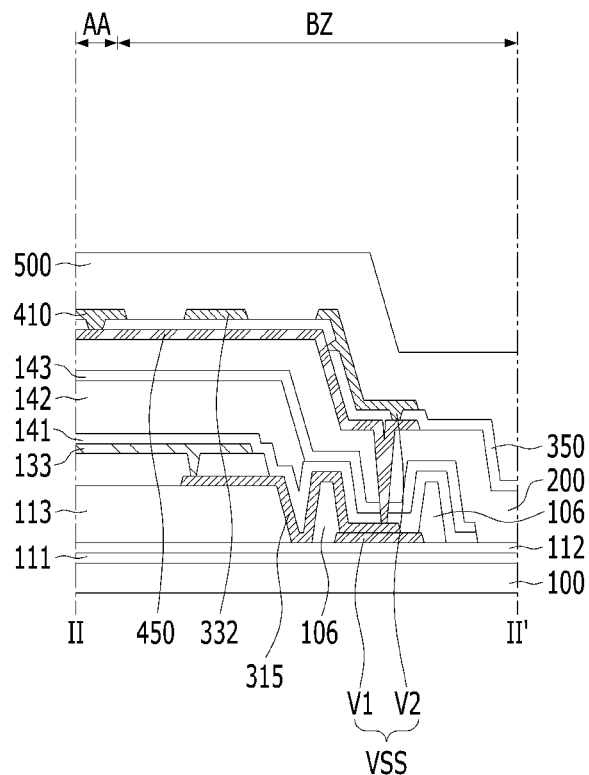
FIG. 5 is a view taken along II-II' of FIG. 2 according to an embodiment of the present disclosure.
Figure 6:
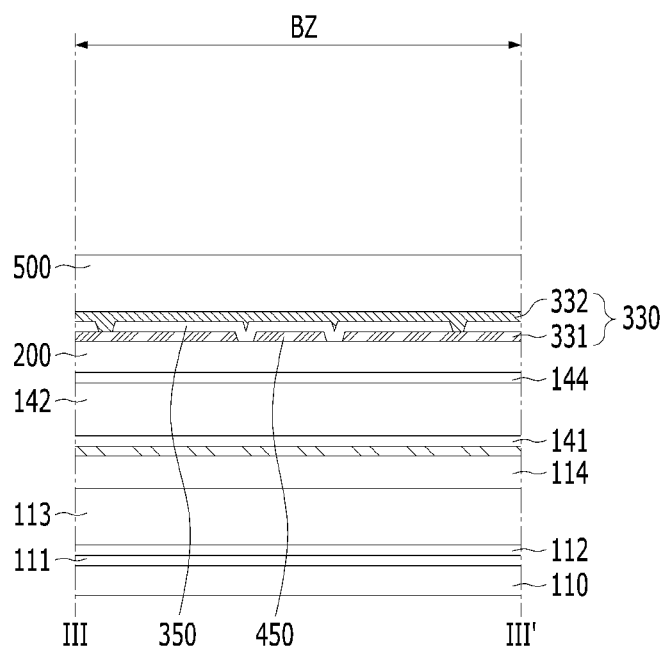
FIG. 6 is a view taken along of FIG. 2 according to an embodiment of the present disclosure.
Figure 7:
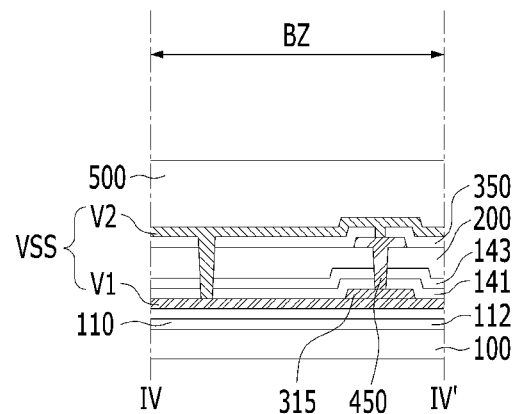
FIG. 7 is a view taken along IV-IV' of FIG. 2 according to an embodiment of the present disclosure.
Figure 8:
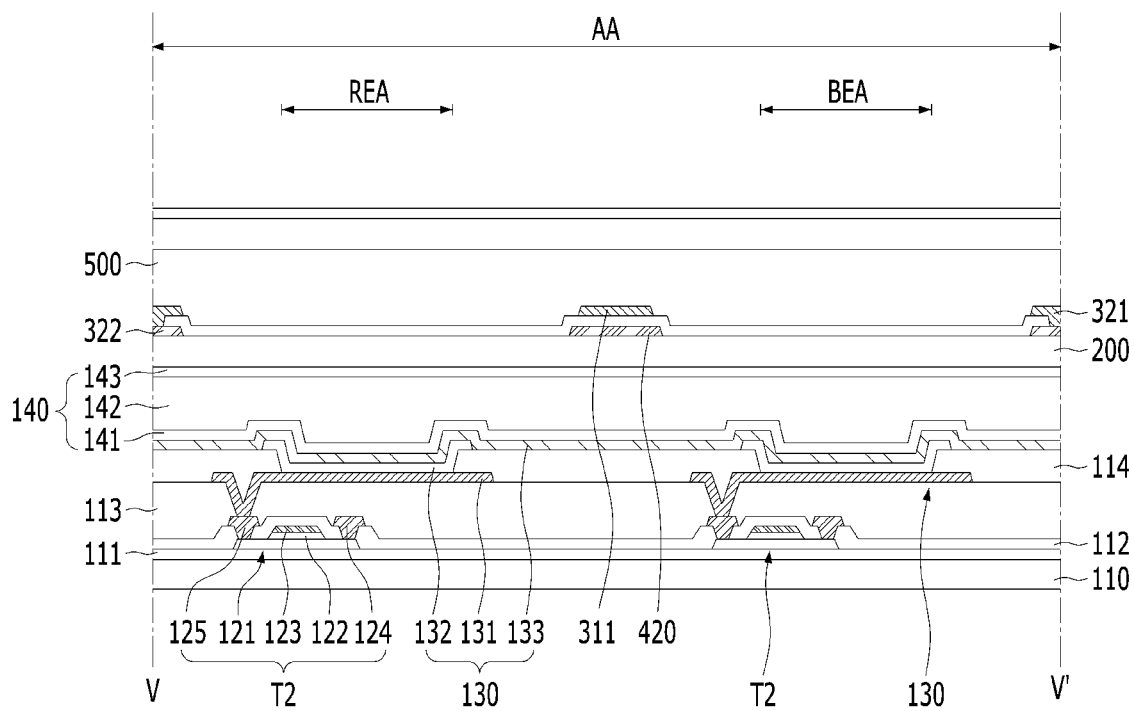
FIG. 8 is a view taken along V-V' of FIG. 3 according to an embodiment of the present disclosure.
Figure 9:
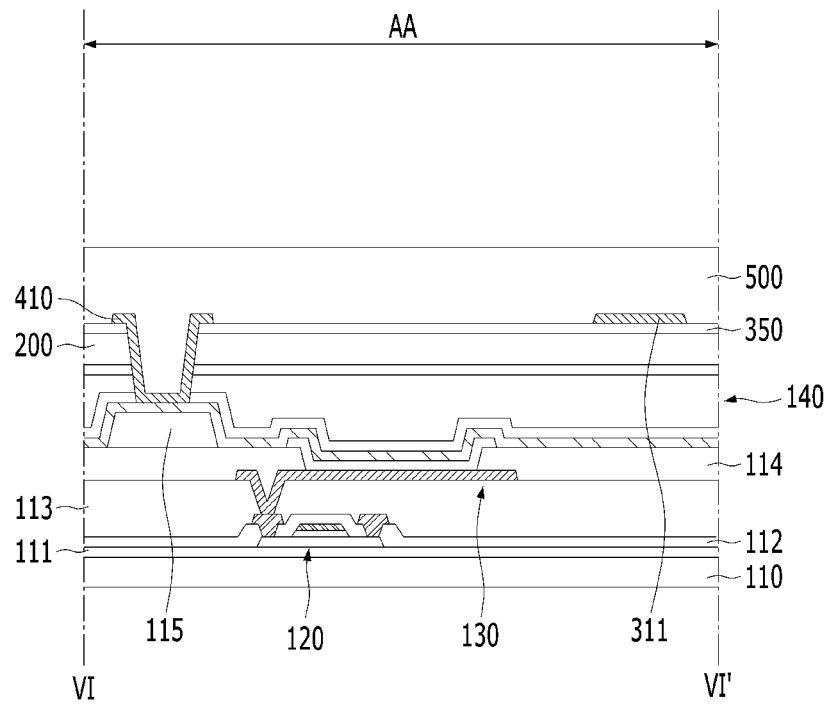
FIG. 9 is a view taken along VI-VI' of FIG. 3 according to an embodiment of the present disclosure.

FIGS. 1 and 2 are views schematically showing a touch display apparatus according to an embodiment of the present disclosure. FIG. 3 is an enlarged view of K region in FIG. 2 according to an embodiment of the present disclosure. FIG. 4 is a view taken along I-I' of FIG. 2 according to an embodiment of the present disclosure. FIG. 5 is a view taken along II-II' of FIG. 2 according to an embodiment of the present disclosure. FIG. 6 is a view taken along of FIG. 2 according to an embodiment of the present disclosure. FIG. 7 is a view taken along IV-IV' of FIG. 2 according to an embodiment of the present disclosure. FIG. 8 is a view taken along V-V' of FIG. 3 according to an embodiment of the present disclosure. FIG. 9 is a view taken along VI-VI' of FIG. 3 according to an embodiment of the present disclosure.

Referring to FIGS. 1 to 9, the touch display apparatus according to the embodiment of the present disclosure may include a device substrate 110. The device substrate 110 may include an insulating material. For example, the device substrate 110 may include glass or plastic. The device substrate 110 may include a display area AA and a bezel area BZ disposed outside the display area AA. For example, the bezel area BZ may surround the display area AA.

The display area AA of the device substrate 110 may display an image provided to user. For example, a plurality of pixel area PA may be disposed in the display area AA of the device substrate 110. The pixel areas PA may be disposed side by side in a first direction and a second direction that is perpendicular to the first direction. As shown in FIG. 3, two pixel areas PA adjacent in the first direction may be alternately disposed. Two pixel areas PA adjacent in the second direction may be alternately disposed. Each of the pixel areas PA may correspond to a color that is different from colors of adjacent pixel areas PA. The touch display apparatus according to the embodiment of the present disclosure may have a pen-tile structure. For example, in the touch display apparatus, the pixel areas PA may include first rows in which red pixel regions R and blue pixel regions B are alternately arranged and second rows in which green pixel regions G are arranged, wherein the first rows and the second rows are alternately disposed.

Light displaying a specific color may be emitted from each pixel area PA. For example, a pixel driving circuit and a light-emitting device 130 being electrically connected to the pixel driving circuit may be disposed in each pixel area PA.

As shown in FIG. 1, the pixel driving circuit may be connected one gate line of gate lines GL applying a gate signal and one data line of data lines DL applying a data signal. For example, the pixel driving circuit may generate a driving current corresponding to the data signal according to the gate signal. The driving current generated by the pixel driving circuit may provide the light-emitting device 130 for one frame. For example, the pixel driving circuit may include a switching thin film transistor T1, a driving thin film transistor T2, and a storage capacitor Cst.

The switching thin film transistor T1 may transmit the data signal to the driving thin film transistor T2 according to the gate signal. The driving thin film transistor T2 may generate the driving current. For example, the driving thin film transistor T2 may include a semiconductor pattern 121, a gate insulating layer 122, a gate electrode 123, a source electrode 124, and a drain electrode 125, as shown in FIG. 8.

The semiconductor pattern 121 may include a semiconductor material. For example, the semiconductor pattern 121 may include at least one of amorphous silicon, polycrystalline silicon and oxide semiconductor. The semiconductor pattern 121 may include a source region, a drain region and a channel region. The channel region may be disposed between the source region and the drain region. The source region and the drain region may have a resistance lower than the channel region. For example, the source region and the drain region may include a conductorized region of oxide semiconductor.

The gate insulating layer 122 may be disposed on the semiconductor pattern 121. For example, the gate insulating layer 122 may overlap the channel region of the semiconductor pattern 121. The source region and the drain region of the semiconductor pattern 121 may be disposed outside the gate insulating layer 122. The gate insulating layer 122 may include an insulating material. For example, the gate insulating layer 122 may include an inorganic insulating material, such as silicon oxide (SiO) and silicon nitride (SiN).

The gate electrode 123 may be disposed on the gate insulating layer 122. For example, the gate electrode 123 may overlap the channel region of the semiconductor pattern 121. The gate electrode 123 may be insulated from the semiconductor pattern 121 by the gate insulating layer 122. For example, a side surface of the gate insulating layer 122 may be continuous with a side surface of the gate electrode 123. The gate electrode 123 may include a conductive material. For example, the gate electrode 123 may include a metal, such as aluminum (Al), titanium (Ti), copper (Cu), molybdenum (Mo), tantalum (Ta), chrome (Cr) and tungsten (W), or an alloy thereof. Furthermore, the gate electrode 123 may have a single-layer structure or a multi-layer structure. The channel region of the semiconductor pattern 121 may have an electric conductivity corresponding to a voltage applied to the gate electrode 123.

The source electrode 124 may include a conductive material. For example, the source electrode 124 may include a metal, such as aluminum (Al), titanium (Ti), copper (Cu), molybdenum (Mo), tantalum (Ta), chrome (Cr) and tungsten (W), or an alloy thereof. Furthermore, the source electrode 124 may have a single-layer structure or a multi-layer structure. The source electrode 124 may be insulated from the gate electrode 123. The source electrode 124 may be disposed on a layer different from the gate electrode 123. For example, an interlayer insulating layer 112 covering the gate electrode 123 may be disposed on the device substrate 110, and the source electrode 124 may be disposed on the interlayer insulating layer 112. The interlayer insulating layer 112 may include an insulating material. For example, the interlayer insulating layer 112 may include an inorganic insulating material, such as silicon oxide (SiO) and silicon nitride (SiN).

The source electrode 124 may be electrically connected to the source region of the semiconductor pattern 121. For example, the interlayer insulating layer 112 may include a source contact hole partially exposing the source region of the semiconductor pattern 121. The source electrode 124 may be in direct contact with the source region of the semiconductor pattern 121 through the source contact hole.

The drain electrode 125 may include a conductive material. For example, the drain electrode 125 may include a metal, such as aluminum (Al), titanium (Ti), copper (Cu), molybdenum (Mo), tantalum (Ta), chrome (Cr) and tungsten (W), or an alloy thereof. Furthermore, the drain electrode 125 may have a single-layer structure or a multi-layer structure. The drain electrode 125 may be insulated from the gate electrode 123. The drain electrode 125 may be disposed on a layer different from the gate electrode 123. For example, the drain electrode 125 may be disposed on the interlayer insulating layer 112. The drain electrode 125 may be disposed on the same layer as the source electrode 124.

The drain electrode 125 may include the same material as the source electrode 124. For example, the drain electrode 125 may be formed simultaneously with the source electrode 124.

The drain electrode 125 may be electrically connected to the drain region of the semiconductor pattern 121. For example, the interlayer insulating layer 112 may include a drain contact hole partially exposing the drain region of the semiconductor pattern 121. The drain electrode 125 may be in direct contact with the drain region of the semiconductor pattern 121 through the drain contact hole.

The switching thin film transistor T1 may have the same structure as the driving thin film transistor T2. For example, the switching thin film transistor T1 may include a gate electrode electrically connected to the corresponding gate line GL, a source electrode electrically connected to the corresponding data line DL, and a drain electrode electrically connected to the gate electrode 123 of the driving thin film transistor T2. The source electrode 124 of the driving thin film transistor T2 may be electrically connected to a first power voltage supply line VDD supplying a positive power voltage. The storage capacitor Cst may maintain a signal applied to the gate electrode 123 of the driving thin film transistor T2 for one frame. For example, the storage capacitor Cst may be connected between the gate electrode 123 and the drain electrode 125 of the driving thin film transistor T2.

The light-emitting device 130 may emit light using the driving current supplied from the pixel driving circuit. For example, the light-emitting device 130 may include a first emission electrode 131, a light-emitting stack 132, and a second emission electrode 133, which are sequentially stacked on the device substrate 110.

The first emission electrode 131 may be electrically connected to the drain electrode 125 of the driving thin film transistor T2. For example, the driving current generated by the pixel driving circuit may be supplied to the first emission electrode 131 of the light-emitting device 130. The first emission electrode 131 may include a conductive material. The first emission electrode 131 may include a material having a high reflectance. For example, the first emission electrode 131 may be a metal, such as aluminum (Al), titanium (Ti), copper (Cu), molybdenum (Mo), tantalum (Ta), chrome (Cr) and tungsten (W), or an alloy thereof. Furthermore, the first emission electrode 131 may have a single-layer structure or a multi-layer structure. For example, the first emission electrode 131 may have a structure in which a reflective electrode made of a metal is disposed between transparent electrodes made of a transparent conductive material, such as ITO and IZO.

The light-emitting stack 132 may generate light having luminance corresponding to a voltage difference between the first emission electrode 131 and the second emission electrode 133. For example, the light-emitting stack 132 may include an emission material layer (EML) having an emission material. The emission material may include an organic material, an inorganic material or a hybrid material. For example, the touch display apparatus according to the embodiment of the present disclosure may be an organic light-emitting display apparatus including an organic emission material.

The light-emitting stack 132 may have a multi-layer structure. For example, the light-emitting stack 132 may further include at least one of a hole injection layer (HIL), a hole transport layer (HTL), an electron transport layer (ETL) and an electron injection layer (EIL). The light-emitting stack 132 may include a plurality of the emission material layer. For example, the light-emitting stack 132 may include a charge generation layer (CGL) between a first emission material layer and a second emission material layer. The second emission material layer may include a material different from the first emission material layer.

The second emission electrode 133 may include a conductive material. The second emission electrode 133 may have a transmittance that is greater than the first emission electrode 131. For example, the second emission electrode 133 may be a transparent electrode made of a transparent conductive material. The second emission electrode 133 may include a transparent conductive oxide material, such as ITO, IZO and AZO. Thus, in the touch display apparatus according to the embodiment of the present disclosure, the light generated by the light-emitting stack 132 of each pixel area PA may be emitted outside through the second emission electrode 133 of the corresponding pixel area PA.

A device buffer layer 111 may be disposed between the device substrate 110 and the pixel driving circuit of each pixel area PA. The device buffer layer 111 may prevent or at least reduce pollution due to the device substrate 110 in a process of forming the pixel driving circuits. The device buffer layer 111 may extend to the bezel area BZ of the device substrate 110. For example, an upper surface of the device substrate 110 toward the pixel driving circuit of each pixel area PA may be completely covered by the device buffer layer 111. The device buffer layer 111 may include an insulating material. For example, the device buffer layer 111 may include an inorganic insulating material, such as silicon oxide (SiO) and silicon nitride (SiN). The device buffer layer 111 may include a multi-layer structure. For example, the device buffer layer 111 may have a stacked structure of an inorganic insulating layer made of silicon oxide (SiO) and an inorganic insulating layer made of silicon nitride (SiN). However, the present disclosure is not limited thereto. For example, the device buffer layer 111 may be made of only an organic insulating material. Alternately, the device buffer layer 111 may have a multi-layer structure of an organic insulating layer and an inorganic insulating layer.

A over-coat layer 113 may be disposed between the pixel driving circuit and the light-emitting device 130 of each pixel area PA. The over-coat layer 113 may remove a thickness difference due to the pixel driving circuit of each pixel area PA. For example, an upper surface of the over-coat layer 113 opposite to the device substrate 110 may be a flat surface. The switching thin film transistor T1, the driving thin film transistor T2 and the storage capacitor Cst in each pixel area PA may be covered by the over-coat layer 113. The over-coat layer 113 may include an insulating material. The over-coat layer 113 may include a material different from the interlayer insulating layer 112. For example, the over-coat layer 113 may include an organic insulating material.

The first emission electrode 131 of each pixel area PA may penetrate the over-coat layer 113 to be electrically connected to the pixel driving circuit of the corresponding pixel area PA. For example, the over-coat layer 113 may include pixel contact holes partially exposing the drain electrode 125 of the driving thin film transistor T2 in each pixel area PA. The first emission electrode 131 of each pixel area PA may be in direct contact with the drain electrode 125 of the driving thin film transistor T2 in the corresponding pixel area PA through one of the pixel contact holes.

The first emission electrode 131 of each pixel area PA may be insulated from the first emission electrode 131 of an adjacent pixel area PA. The first emission electrode 131 of each pixel area PA may be spaced away from the first emission electrode 131 of adjacent pixel area PA. For example, a bank insulating layer 114 may be disposed between the first emission electrodes 131 of adjacent pixel areas PA. The bank insulating layer 114 may include an insulating material. For example, the bank insulating layer 114 may include an organic insulating material. The bank insulating layer 114 may cover an edge of the first emission electrode 131 in each pixel area PA. The light-emitting stack 132 and the second emission electrode 133 of each pixel area PA may be stacked on a portion of the corresponding first emission electrode 131 exposed by the bank insulating layer 114. For example, the bank insulating layer 114 may define an emission area BEA, GEA and REA in each pixel area PA.

The light-emitting device 130 of each pixel area PA may have the same structure as the light-emitting device 130 of an adjacent pixel area PA. For example, the light-emitting stack 132 of each pixel area PA may extend along a surface of the bank insulating layer 114 to be connected to the light-emitting stack 132 of each pixel area PA. The light emitted from the light-emitting device 130 of each pixel area PA may display the same color as the light emitted from the light-emitting device 130 of adjacent pixel area PA. For example, the light-emitting stack 132 of each pixel area PA may emit white light. The light-emitting stack 132 of each pixel area PA may be formed simultaneously with the light-emitting stack 132 of adjacent pixel area PA. Thus, in the touch display apparatus according to the embodiment of the present disclosure, a process of forming the light-emitting stack 132 on each pixel area PA may be simplified.

A voltage applied to the second emission electrode 133 of each pixel area PA may be the same as a voltage applied to the second emission electrode 133 of an adjacent pixel area PA. For example, the second emission electrode 133 of each pixel area PA may be electrically connected to a second power voltage supply line VSS supplying a negative power voltage. Each second emission electrode 133 of each pixel area PA may be supplied the negative power voltage from the auxiliary line 400 as well as through the second emission electrode 133 of a pixel that is closest to the bezel area BZ and is connected to the second power supply VSS as will be further described below. Thus, in the touch display apparatus according to the embodiment of the present disclosure, the luminance of the light emitted from the light-emitting device 130 of each pixel area PA may be adjusted by the data signal applied to the corresponding pixel area PA. The second emission electrode 133 of each pixel area PA may be electrically connected to the second emission electrode 133 of an adjacent pixel area PA. For example, the second emission electrode 133 of each pixel area PA may be in direct contact with the second emission electrode 133 of adjacent pixel area PA. The second emission electrode 133 of each pixel area PA may be formed simultaneously with the second emission electrode 133 of adjacent pixel area PA. Therefore, in the touch display apparatus according to the embodiment of the present disclosure, a process of forming the second emission electrode 133 on each pixel area PA may be simplified.

The second power voltage supply line VSS may be disposed on the bezel area BZ of the device substrate 110. For example, the second power voltage supply line VSS may extend along an edge of the display area AA, as shown in FIG. 2. Thus, in the touch display apparatus according to the embodiment of the present disclosure, a noise due to external signal may be blocked by the second power voltage supply line VSS. Therefore, in the touch display apparatus according to the embodiment of the present disclosure, the distortion of the signal due to the external signal may be effectively prevented.

The second power voltage supply line VSS may have a multi-layer structure. For example, the second power voltage supply line VSS may have a stacked structure of a first supply line V1 and a second supply line V2, as shown in FIG. 5. The second supply line V2 may be disposed on the first supply line V1. Thus, the second supply line V2 and the first supply line V1 are overlapping. The first supply line V1 may be formed using a process of forming the pixel driving circuit in each pixel area PA. For example, the first supply line V1 may include the same material as the source electrode 124 and the drain electrode 125 of each pixel area PA.

The device buffer layer 111 and the interlayer insulating layer 112 may extend on the bezel area BZ of the device substrate 110. For example, the second power voltage supply line VSS may be disposed on the interlayer insulating layer 112. The over-coat layer 113 and the bank insulating layer 114 may include an end disposed between the display area AA of the device substrate 110 and the second power voltage supply line VSS. Thus, in the touch display apparatus according to the embodiment of the present disclosure, a process of electrically connecting the second emission electrode 133 of each light-emitting device 130 and the second power voltage supply line VSS may be simplified.

The second power voltage supply line VSS may be electrically connected to the second emission electrode 133 of each light-emitting device 130 through an intermediate electrode 315. As shown in FIG. 5, a second emission electrode 133 of a pixel PA closest to the bezel area BZ extends from the display area AA to the bezel area BZ and is electrically connected to the second power voltage supply line VSS via the intermediate electrode 315. Since the second emission electrodes 133 of pixels are connected to each other, the second emission electrode 133 of the pixel closest to the bezel area BZ supplies the second power supply VSS to at least one other pixel that is closer to the center of the display area AA. Since the other pixel that is closer to the center of the display area AA also receives the second power supply voltage VSS via the auxiliary line 400, a magnitude of the second power supply voltage VSS received by the pixel closer to the center of the display area AA is substantially the same as the magnitude of the second power supply voltage VSS received by the pixel closet to the bezel area BZ thereby improving luminance uniformity.

As shown in FIG. 5, in one embodiment the intermediate electrode 315 may extend such that a portion of the intermediate electrode 315 is between the over-coat layer 113 and the bank insulating layer 114, and the second emission electrode 133 of a light-emitting device 130 may penetrate the bank insulating layer 114 to be electrically connected to the intermediate electrode 315. As shown in FIG. 5, the intermediate electrode 315 includes a first end that is connected to the second power voltage supply line VSS and a second end that is connected to the second emission electrode 133 of a pixel where the second emission electrode 133 extends from the display area AA to the bezel area BZ. Thus, in the touch display apparatus according to the embodiment of the present disclosure, the disconnection of the second emission electrode 133 due to a thickness difference by the over-coat layer 113 and the bank insulating layer 114 may be prevented. Therefore, in the touch display apparatus according to the embodiment of the present disclosure, the second emission electrode 133 of each light-emitting device 130 may be stably connected to the second power voltage supply line VSS.

The intermediate electrode 315 may be formed using a process of forming the light-emitting devices 130. For example, the intermediate electrode 315 may include the same material as the first emission electrode 131 of each light-emitting device 130. Thus, in the touch display apparatus according to the embodiment of the present disclosure, the negative power voltage may be stably supplied to each pixel area PA, without a decrease in the process efficiency.

An encapsulating unit 140 may be disposed on the light-emitting device 130 of each pixel area PA. The encapsulating unit 140 may prevent or at least reduce the damage of the light-emitting devices 130 due to external moisture and/or oxygen. The light-emitting device of each pixel area PA may be completely covered by the encapsulating unit 140. For example, the encapsulating unit 140 may extend on the bezel area BZ of the device substrate 110.

The encapsulating unit 140 (e.g., an encapsulation layer) may include a plurality of encapsulating layers including at least one inorganic encapsulating layer 141 and 143, and at least one organic encapsulating layer 142. For example, the encapsulating unit 140 may have a structure in which at least one organic encapsulating layer 142 is disposed between inorganic encapsulating layers 141 and 143. The uppermost layer of the encapsulating unit 140 may be the inorganic encapsulating layer 141 and 143. For example, an upper surface and a side surface of the organic encapsulating layer 142 may be covered by the inorganic encapsulating layer 141 and 143. Thus, in the touch display apparatus according to the embodiment of the present disclosure, the penetration of the external moisture and oxygen may be effectively blocked or at least reduced.

The inorganic encapsulating layers 141 and 143 may include an inorganic insulating material. For example, the inorganic encapsulating layers 141 and 143 may include an inorganic insulating material capable of low-temperature deposition, such as silicon nitride (SiN), silicon oxide (SiO), silicon oxynitride (SiON) and aluminum oxide ($Al_2O_3$). Thus, in the touch display apparatus according to the embodiment of the present disclosure, the damage of the light-emitting stacks 132 due to a process of forming the inorganic encapsulating layer 141 and 143 may be prevented or at least reduced.

The organic encapsulating layer 142 may relieve the stress due to the inorganic encapsulating layer 141 and 143. For example, the organic encapsulating layer 142 may include an organic insulating material, such as acrylic resin, epoxy resin, polyimide, polyethylene and silicon oxycarbide (SiOC). A thickness difference due to the light-emitting devices 130 may be removed by the organic encapsulating layer 142. For example, an upper surface of the organic encapsulating layer 142 opposite to the device substrate 110 may be a flat surface.

The organic encapsulating layer 142 may be formed by inkjet process. For example, at least one dam 106 may be disposed on the bezel area BZ of the device substrate 110. The dam 106 may block the flow of the organic encapsulating layer 142. The dam 106 may extend along an edge of the display area AA. For example, in the touch display apparatus according to the embodiment of the present disclosure, the organic encapsulating layer 142 may be formed in a region defined by the dam 106. The dam 106 may be formed using a process of forming at least one of insulating layers, which are disposed between the device substrate 110 and the encapsulating unit 140. For example, the dam 106 may be formed simultaneously with the over-coat layer 113. The dam 106 may include the same material as the over-coat layer 113. For example, the dam 106 may include an organic insulating material. The interlayer insulating layer 112 may extend on the bezel area BZ of the device substrate 110. For example, the dam 106 may be disposed on the interlayer insulating layer 112. A thickness of the dam 106 may be the same as a thickness of the over-coat layer 113.

A touch sensor Cm may be disposed on the encapsulating unit 140. The touch sensor Cm may sense a touch of user and/or a tool. For example, the touch sensor Cm may sense the presence or absence of a touch and a touch position by a change of the mutual capacitance. The touch sensor Cm may include a first touch line 310 and a second touch line 320, as shown in FIGS. 2 and 3.

A touch driving signal may be applied to the first touch line 310. For example, the first touch line 310 (e.g., a first touch electrode line) may function as a touch driving line. The first touch line 310 may include first touch electrodes 311 and first touch bridges312. The first touch electrodes 311 may be disposed side by side on the encapsulating unit 140 along a first direction. The first touch bridges 312 may electrically connect the first touch electrodes 311. Each of the first touch bridges 312 may extend in the first direction. For example, each of the first touch electrodes 311 may be connected to the adjacent first touch electrode 311 in the first direction by one of the first touch bridges 312.

The first touch electrodes 311 may include a conductive material. The first touch electrodes 311 may include a material having a relatively low resistance. For example, the first touch electrodes 311 may include a metal, such as aluminum (Al), titanium (Ti), copper (Cu), molybdenum (Mo) and tantalum (Ta), or an alloy thereof. Each of the first touch electrodes 311 may have a single-layer structure or a multi-layer structure. For example, the first touch electrodes 311 may have a three-layer structure, such as Ti/Al/Ti, MoTi/Cu/MoTi and Ti/Al/Mo.

The first touch bridges 312 may include a conductive material. The first touch bridges 312 may include a material having a relatively low resistance. For example, the first touch bridges 312 may include a metal, such as aluminum (Al), titanium (Ti), copper (Cu), molybdenum (Mo) and tantalum (Ta), or an alloy thereof. The first touch bridges 312 may include the same material as the first touch electrodes 311. Each of the first touch bridges 312 may have a single-layer structure or a multi-layer structure. For example, the first touch bridges 312 may have a three-layer structure, such as Ti/Al/Ti, MoTi/Cu/MoTi and Ti/Al/Mo. The first touch bridges 312 may have the same structure as the first touch electrodes 311. The first touch bridges 312 may be disposed on the same layer as the first touch electrodes 311. For example, each of the first touch bridges 312 may be in direct contact with the corresponding first touch electrodes 311.

The second touch line 320 (e.g., a second touch electrode line) may include second touch electrodes 321 and second touch bridges 322. The second touch electrodes 321 may be disposed side by side on the encapsulating unit 140 along a second direction that is different from the first direction. The second touch electrodes 321 may be disposed on the same layer as the first touch electrodes 311. The second touch electrodes 321 may be insulated from the first touch electrodes 311. For example, the second touch electrodes 321 may be disposed between the first touch electrodes 311. The second touch electrodes 321 may have the same shape as the first touch electrodes 311. For example, the first touch electrodes 311 and the second touch electrodes 321 may be alternately arranged on the encapsulating unit 140. Thus, in the touch display apparatus according to the embodiment of the present disclosure, the charges charged by the touch driving signal may be discharged through the second touch line 320. For example, the second touch line 320 may function as a touch sensing line. Therefore, the touch display apparatus according to the embodiment of the present disclosure may sense the presence or absence of the touch of the user and/or the tool, and the touch position using the touch sensor Cm.

The second touch electrodes 321 may include a conductive material. The second touch electrodes 321 may include a material having a relatively low resistance. For example, the second touch electrodes 321 may include a metal, such as aluminum (Al), titanium (Ti), copper (Cu), molybdenum (Mo) and tantalum (Ta), or an alloy thereof. The second touch electrodes 321 may include the same material as the first touch electrodes 311. Each of the second touch electrodes 321 may have a single-layer structure or a multi-layer structure. For example, the second touch electrodes 321 may have a three-layer structure, such as Ti/Al/Ti, MoTi/Cu/MoTi and Ti/Al/Mo. The second touch electrodes 321 may have the same structure as the first touch electrodes 311.

The second touch electrodes 321 may be disposed on the same layer as the first touch electrodes 311 and the first touch bridges 312. The second touch electrodes 321 may be insulated from the first touch bridges 312. The second touch electrodes 321 may be spaced away from the first touch bridges 312. For example, the first touch bridges 312 may cross between the second touch electrodes 321.

The second touch bridges 322 may electrically connect the second touch electrodes 321. Each of the second touch bridges 322 may extend in a second direction. For example, each of the second touch electrodes 321 may be connected to the adjacent second touch electrodes 321 in the second direction by one of the second touch bridges 322. In one embodiment, a pair of adjacent second touch electrodes 321 are connected to each other via a plurality of second bridges 322 as shown in FIG. 2. The second direction may be different from the first direction. For example, the second direction may be perpendicular to the first direction. The second touch bridges 322 may cross between the first touch electrodes 311. For example, each of the second touch bridges 322 may intersect one of the first touch bridges 312. The second touch bridges 322 may be insulated from the first touch bridges 312. The second touch bridges 322 may be disposed on a layer different from the first touch bridges 312. For example, the touch sensor Cm may include a touch insulating layer 350 on the second touch bridges 322, and the first touch electrodes 311, the first touch bridges 312 and the second touch electrodes 321 may be disposed on the touch insulating layer 350.

The touch insulating layer 350 may include an insulating material. For example, the touch insulating layer 350 may include an inorganic insulating material, such as silicon oxide (SiO) and silicon nitride (SiN). However, the present disclosure is not limited thereto. For example, the touch insulating layer 350 may include an organic insulating material. Alternately, the touch insulating layer 350 may have a multi-layer structure of an organic insulating layer and an inorganic insulating layer. The touch insulating layer 350 may include touch contact holes partially exposing each second touch bridge 322. Each of the second touch electrodes 321 may be connected to the corresponding second touch bridge 322 through one of the touch contact holes.

The second touch bridges 322 may include a conductive material. The second touch bridges 322 may include a material having a relatively low resistance. For example, the second touch bridges 322 may include a metal, such as aluminum (Al), titanium (Ti), copper (Cu), molybdenum (Mo) and tantalum (Ta), or an alloy thereof. Each of the second touch bridges 322 may have a single-layer structure or a multi-layer structure. For example, the second touch bridges 322 may have a three-layer structure, such as Ti/Al/Ti, MoTi/Cu/MoTi and Ti/Al/Mo.

The first touch electrodes 311, the first touch bridges 312, the second touch electrodes 321, and the second touch bridges 322 of the touch sensor Cm may be disposed in the display area AA. The emission areas BEA, GEA and REA of each pixel area PA may be disposed between the first touch electrodes 311, the first touch bridges 312, the second touch electrodes 321 and the second touch bridges 322. The first touch line 310 and the second touch line 320 may be disposed outside the light-emitting devices 130. For example, the first touch electrodes 311, the first touch bridges 312, the second touch electrodes 321 and the second touch bridges 322 may overlap the bank insulating layer 114. In a plan view, each of the first touch electrodes 311 and each of the second touch electrodes 321 may have a mesh shape including openings overlapping with the emission area BEA, GEA and REA of each pixel area PA. Thus, in the touch display apparatus according to the embodiment of the present disclosure, the accuracy of the touch sensing using the touch sensor Cm may be improved, and the decrease in light extraction efficiency due to the first touch electrodes 311, the first touch bridges 312, the second touch electrodes 321 and the second touch bridges 322 of the touch sensor Cm may be minimized.

A touch buffer layer 200 may be disposed between the encapsulating unit 140 and the touch sensor Cm. For example, the second touch bridges 322 may be disposed between the touch buffer layer 200 and the touch insulating layer 350. The touch buffer layer 200 may reduce a parasitic capacitance generated between the second emission electrode 133 of each light-emitting device 130 and the touch sensor Cm. For example, a distance between the first touch line 310 of the touch sensor Cm and the second emission electrode 133 of each light-emitting device 130 and a distance between the second touch line 320 of the touch sensor Cm and the second emission electrode 133 of each light-emitting device 130 may be increased by the touch buffer layer 200. Thus, in the touch display apparatus according to the embodiment of the present disclosure, the accuracy of the touch sensing by the touch sensor Cm may be improved. The touch buffer layer 200 may include an insulating material. For example, the touch buffer layer 200 may include an inorganic insulating material, such as silicon oxide (SiO) and silicon nitride (SiN).

The second supply line V2 of the second power voltage supply line VSS may include the same material as the touch electrodes 311 and 321. The second supply line V2 may be disposed on the same layer as the touch electrodes 311 and 321. For example, the touch buffer layer 200 and the touch insulating layer 350 may extend on the second power voltage supply line VSS, and the second supply line V2 may penetrate the touch buffer layer 200 and the touch insulating layer 350 to be electrically connected to the first supply line V1. The second supply line V2 may extend parallel to the first supply line V1. Thus, in the touch display apparatus according to the embodiment of the present disclosure, a noise applied to the touch sensor Cm by the external signal may be blocked by the second supply line V2. Therefore, in the touch display apparatus according to the embodiment of the present disclosure, the accuracy of the touch sensing may be improved.

At least one auxiliary line 400 may be disposed on the encapsulating unit 140. As shown in FIG. 2, the auxiliary line 400 may cross the display area AA of the device substrate 110. The auxiliary line 400 may extend along a surface of the encapsulating unit 140. For example, the auxiliary line 400 may be electrically connected to the second power voltage supply line VSS on the bezel area BZ of the device substrate 110, as shown in FIGS. 2 and 5. The auxiliary line 400 may be connected to the second power voltage supply line VSS at the outside of the dam 106 which is disposed closest to the display area AA. Thus, in the touch display apparatus according to the embodiment of the present disclosure, the auxiliary line 400 may be connected to the second power voltage supply line VSS, without penetrating the relatively thick organic encapsulating layer 142. Therefore, in the touch display apparatus according to the embodiment of the present disclosure, the efficiency in a process of electrically connecting the auxiliary line 400 to the second power voltage supply line VSS may be improved.

The second power voltage supply line VSS may include a region disposed between the dams 106. For example, the auxiliary line 400 may be electrically connected to the second power voltage supply line VSS through voltage contact holes at a location between the dams 106. Thus, in the touch display apparatus according to the embodiment of the present disclosure, the auxiliary line 400 may be electrically connected to the second power voltage supply line VSS, without increasing the bezel area BZ.

The auxiliary line 400 may be disposed outside the emission areas BEA, GEA and REA. For example, the auxiliary line 400 may overlap the bank insulating layer 114. Thus, in the touch display apparatus according to the embodiment of the present disclosure, the loss of the light due to the auxiliary line 400 may be prevented.

The auxiliary line 400 may include auxiliary electrodes 410 and auxiliary bridges 420. The auxiliary line 400 may cross between the first touch electrodes 311 and the second touch electrodes 321. The auxiliary electrodes 410 may include the same material as the first and second touch electrodes 311 and 321. For example, the auxiliary electrodes 410 may be disposed between the touch electrodes 311 and 321. As shown in FIG. 2, a second touch electrode 321 may be divided into a plurality of portions with the auxiliary electrode 410 disposed between the portions of the second touch electrode 321 as shown in FIG. 2. Each of the auxiliary bridges 420 may intersect one of the first touch bridges 312 and the second touch bridges 322. The auxiliary bridges 420 may be disposed on a layer different from the auxiliary electrodes 410. For example, each of the auxiliary bridges 420 may intersect one of the first touch bridges 312. The auxiliary line 400 may extend in the same direction as the second touch line 320. For example, the auxiliary electrodes 410 may be connected in the second direction by the auxiliary bridges 420. Each of the auxiliary bridges 420 may extend in the second direction. For example, the auxiliary bridges 420 may be disposed side by side with the second touch bridges 322. In one embodiment, an auxiliary bridge 420 is disposed between a pair of second touch bridges 322 in a plan view of the touch display device as shown in FIG. 2. The auxiliary bridges 420 may include the same material as the second touch bridges 322. The auxiliary bridges 420 may be disposed on the same layer as the second touch bridges 322. For example, the auxiliary bridges 420 may be disposed between the touch buffer layer 200 and the touch insulating layer 350.

The second emission electrode 133 of each light-emitting device 130 may be electrically connected to the auxiliary line 400 in the display area AA. For example, the auxiliary electrodes 410 may be in direct contact with the second emission electrode 133 of each light-emitting device 130 by penetrating the encapsulating unit 140, the touch buffer layer 200 and the touch insulating layer 350 on the bank insulating layer 114, as shown in FIGS. 2 and 9. Thus, in the touch display apparatus according to the embodiment of the present disclosure, the negative power voltage applied to a central region of the display area AA may be the same as the negative power voltage applied to an edge region of the display area AA. Thus, the magnitude of the negative power voltage applied to a first pixel in the central region of the display area AA is substantially the same as the magnitude of the negative power voltage applied to a second pixel at the edge region of the display area AA that is closer to the bezel area BZ. Therefore, in the touch display apparatus according to the embodiment of the present disclosure, a luminance deviation due to a voltage drop may be prevented or at least reduced.

Figure 10:
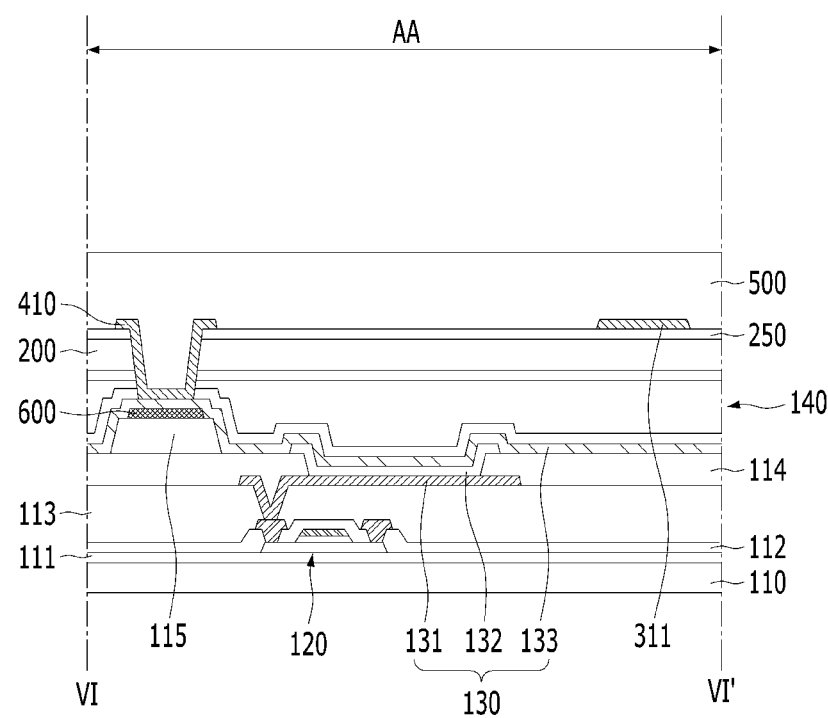
FIGS. 10 and 11 are views showing the touch display apparatus according to another embodiment of the present disclosure.

A spacer 115 may be disposed on the bank insulating layer 114. The spacer 115 may include an insulating material. For example, the spacer 115 may include an organic insulating material. The spacer 115 may include the same material as the bank insulating layer 114. For example, the spacer 115 may be formed simultaneously with the bank insulating layer 114 using a half-tone mask. The organic encapsulating layer 142 may have a relatively small thickness on the spacer 115. For example, a straight distance between the spacer 115 and the touch insulating layer 350 may be smaller than a straight distance between the bank insulating layer 114 and the touch insulating layer 350. The second emission electrode 133 of each light-emitting device 130 may extend onto the spacer 115. A portion of the second emission electrode 133 that is on the spacer 115 contacts the auxiliary line 400 (e.g., the auxiliary electrode 410) to electrically connect the second emission electrode 133 to the auxiliary line 400. As shown in FIG. 10, the auxiliary electrode 410 includes a first end that is on a same layer as the touch electrodes (e.g., first touch electrodes 311) and a second end that contacts the second emission electrode 133 that is on a different layer than the touch electrodes. Accordingly, at least a portion of each auxiliary electrode is on a same layer as the touch electrodes. Thus, in the touch display apparatus according to the embodiment of the present disclosure, the process efficiency for electrically connecting the second emission electrode 133 of each light-emitting device 130 to the auxiliary line 400 may be improved. And, in the touch display apparatus according to the embodiment of the present disclosure, the second emission electrode 133 of each light-emitting device 130 may be stably connected to the auxiliary line 400.

Various signals to realize the image may be applied to each pixel area PA through the bezel area BZ of the device substrate 110. For example, the bezel area BZ of the device substrate 110 may include a pad area PD in which display pads 104, touch pads 304, a first power voltage supply pad 804 and a second power voltage supply pad 704 are disposed. The dams 106 may be disposed between the display area AA and the pad area PD. For example, the display pads 104, the touch pads 304, the first power voltage supply pad 804 and the second power voltage supply pad 704 may be spaced away from the encapsulating unit 140. Thus, in the touch display apparatus according to the embodiment of the present disclosure, it is possible to prevent some of the display pads 104, the touch pads 304, the first power voltage supply pad 804 and the second power voltage supply pad 704 from being unintentionally covered by the organic encapsulating layer 142. Therefore, in the touch display apparatus according to the embodiment of the present disclosure, the distortion of the signal transmitted through the display pads 104 and the touch pads 304 may be prevented.

The gate lines GL and/or the data lines DL may be electrically connected to the display pads 104. For example, the data signal applied to each pixel area PA may be transmitted through one of the display pads 104 and one of the data lines DL. The first power voltage supply line VDD may be electrically connected to the first power voltage supply pad 804. The second power voltage supply pad 704 may be electrically connected to the second power voltage supply line VSS. The first power voltage supply pad 804, the second power voltage supply pad 704 and the touch pads 304 may be disposed side by side with the display pads 104. For example, the pad area PD may be disposed on a side of the display area AA.

Each of the touch pads 304 may include a lower pad electrode 304a and an upper pad electrode 304b on the lower pad electrode 304a. The touch pads 304 may be formed using a process of forming the pixel driving circuits, the light-emitting devices 130 and the touch sensor Cm. For example, the lower pad electrode 304a may include the same material as the source electrode 124 and the drain electrode 125 of each pixel driving circuit, and the upper pad electrode 304b may include the same material as the first touch electrodes 311, the first touch bridges 312 and the second touch electrodes 321. The display pads 104, the first power voltage supply pad 804 and the second power voltage supply pad 704 may have the same structure as the touch pads 304. For example, each of the display pads 104, the first power voltage supply pad 804 and the second power voltage supply pad 704 may include a lower pad electrode and an upper pad electrode on the lower pad electrode. For example, the display pads 104, the first power voltage supply pad 804 and the second power voltage supply pad 704 may be formed simultaneously with the touch pads 304.

The touch pads 304 may be electrically connected to the first touch line 310 and the second touch line 320 by touch routing lines 330. For example, the touch driving signal may be applied to the first touch line 310 through one of the touch pads 304 and one of the touch routing lines 330, and the charges charged by touch driving signal may be discharged through the second touch line 320, one of the touch routing lines 330 and one of the touch pads 304.

The touch routing lines 330 may be formed using a process of forming the touch sensor Cm. For example, each of the touch routing lines 330 may have a stacked structure of a lower routing line 331 including the same material as the second touch bridges 322, and an upper routing line 332 including the same material as the first touch bridges 312. The upper routing line 332 of each touch routing line 330 may be electrically connected to the lower routing line 331 of the corresponding touch routing line 330. For example, the touch insulating layer 350 may include routing contact holes partially exposing the lower routing line 331 of each touch routing line 330. The upper routing line 332 of each touch routing line 330 may be in direct contact with the lower routing line 331 of the corresponding touch routing line 330 through the routing contact holes. Thus, in the touch display apparatus according to the embodiment of the present disclosure, the first touch line 310 and the second touch line 320 may be stably connected to the corresponding touch pad 304 by the touch routing lines 330. And, in the touch display apparatus according to the embodiment of the present disclosure, a resistance of each touch routing line 330 may be reduced. Therefore, in the touch display apparatus according to the embodiment of the present disclosure, a signal delay due to the touch routing lines 330 may be minimized.

The touch routing lines 330 may extend between the second power voltage supply line VSS and the display area AA. For example, the auxiliary line 400 may be connected to the second power voltage supply line VSS through a connection electrode 450 intersecting at least one of the touch routing lines 330. The connection electrode 450 may be disposed on a layer different from the upper routing line 332. For example, the connection electrode 450 may be disposed between the touch buffer layer 200 and the touch insulating layer 350. The connection electrode 450 may include the same material as the auxiliary bridges 420. The lower routing line 331 of each touch routing line 330 may be spaced away from the connection electrode 450. For example, the upper routing line 332 of each touch routing line 330 may be electrically connected to the lower routing line 331 of the corresponding touch routing line 330 at the outside of the connection electrode 450. That is, the upper routing line 332 of each touch routing line 330 may be electrically connected to the lower routing line 331 of the corresponding touch routing line 330 at a location that is non-overlapping with the connection electrode 450.

The connection electrode 450 may extend between the dams 106. For example, a portion of the second supply line V2 may be connected to the first supply line V1 through the connection electrode 450. The intermediate electrode 315 may extend between the first supply line V1 and the connection electrode 450. For example, the intermediate electrode 315 and the connection electrode 450 may be stacked between a portion of the first supply line V1 and a portion of the second supply line V2. Thus, in the touch display apparatus according to the embodiment of the present disclosure, the intermediate electrode 315 and the connection electrode 450 may be stably connected to the second power voltage supply line VSS.

Accordingly, in the touch display apparatus according to the embodiment of the present disclosure, the touch sensor Cm including touch electrodes 311 and 321 may be disposed on the encapsulating unit 140 covering the light-emitting devices 130, the auxiliary line 400 crossing between the touch electrodes 311 and 321 may be electrically connected to the second power voltage supply line VSS at the outside of the display area AA, and the second emission electrode 133 of each light-emitting device 130 may be electrically connected to the auxiliary line 400 in the display area AA. Thus, in the touch display apparatus according to the embodiment of the present disclosure, the luminance deviation due to the voltage drop may be effectively prevented. Therefore, in the touch display apparatus according to the embodiment of the present disclosure, the quality of the image may be improved.

FIG. 10 is a view showing the touch display apparatus according to another embodiment of the present disclosure. FIG. 10 is a view taken along VI-VI' of FIG. 3 according to the other embodiment. The touch display apparatus according to another embodiment of the present disclosure may further include a conductive pattern 600 disposed on an upper surface of the spacer 115 opposite to the device substrate 110. That is, the conductive pattern 600 is between auxiliary line 400 (e.g., the auxiliary electrode 410) and the portion of second emission electrode 133 that contacts the auxiliary line 400. The conductive pattern 600 may include a conductive material. For example, the conductive pattern 600 may include a metal, such as aluminum (Al), titanium (Ti), copper (Cu), molybdenum (Mo), tantalum (Ta), chrome (Cr) and tungsten (W), or an alloy thereof. The second emission electrode 133 of each light-emitting device 130 may be electrically connected to the conductive pattern 600.

Thus, in the touch display apparatus according to another embodiment of the present disclosure, unstable connection between the second emission electrode 133 and one of the auxiliary electrodes 410 of the auxiliary line due to a process of forming a hole penetrating the encapsulating unit 140, the touch buffer layer 200 and the touch insulating layer 350 may be prevented. That is, in the touch display apparatus according to another embodiment of the present disclosure, even when a portion of the second emission electrode 133 may be damaged by the process of forming the hole penetrating the encapsulating unit 140, the touch buffer layer 200 and the touch insulating layer 350, the second emission electrode 133 may be stably connected to one of the auxiliary electrodes 410 of the auxiliary line.

Figure 11:
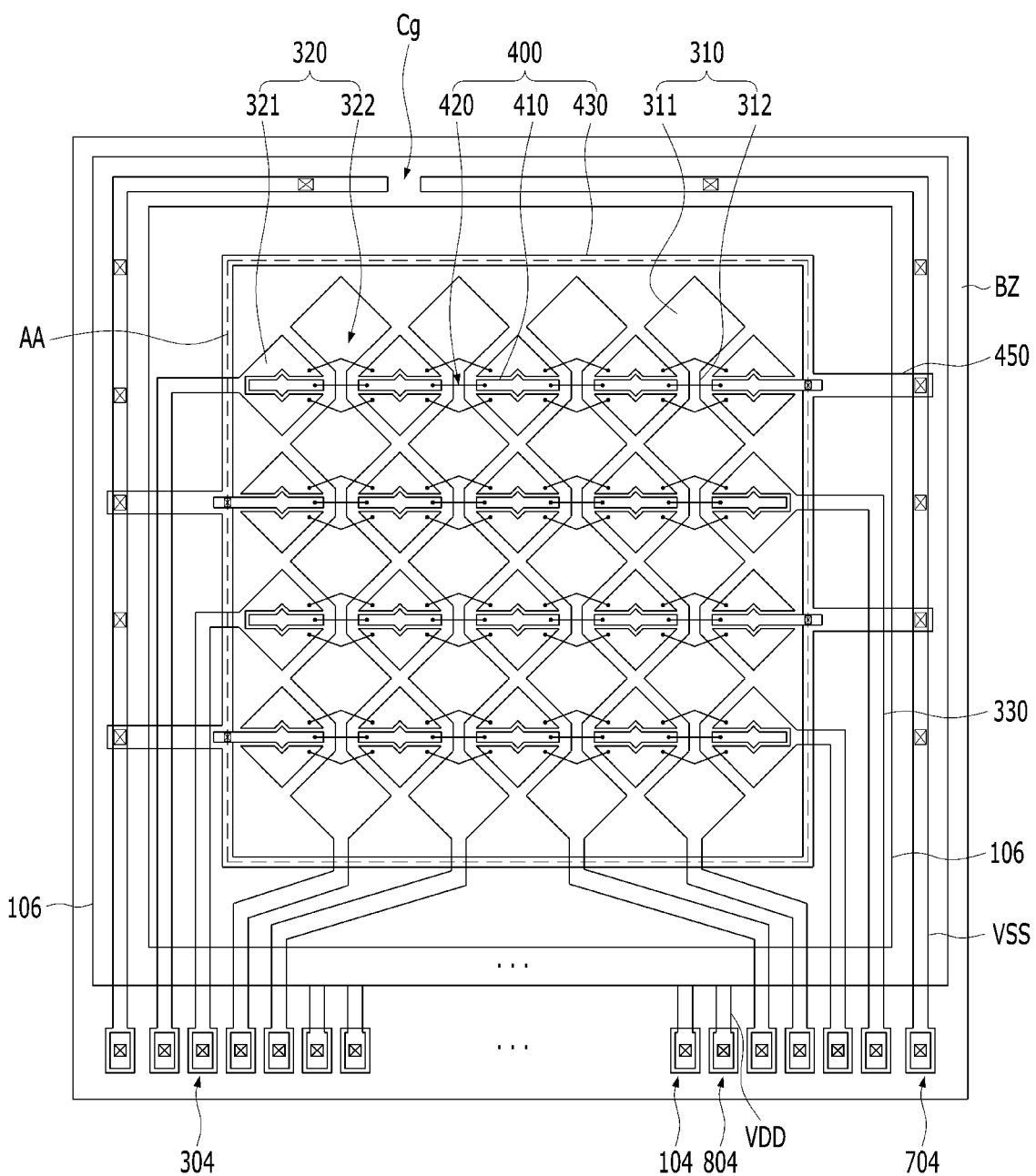

In the touch display apparatus according to another embodiment of the present disclosure, the auxiliary line 400 may further include a dummy line 430 surrounding the display area AA such that the dummy line 430 is between the display area AA and the touch routing lines 330 in the plan view, as shown in FIG. 11. The dummy line 430 may be electrically connected to the second power voltage supply line VSS through the connection electrode 450. The dummy line 430 may extend along between the touch routing lines 330 and the touch electrodes 311 and 321. Thus, in the touch display apparatus according to another embodiment of the present disclosure, a parasitic capacitance between the touch routing lines 330 and the touch electrodes 311 and 321 may be prevented or at least reduced. And, in the touch display apparatus according to another embodiment of the present disclosure, the distortion of the signal applied by the touch lines 310 and 320 due to a signal applied by the touch routing lines 330 may be prevented or at least reduced. Therefore, in the touch display apparatus according to the embodiment of the present disclosure, the accuracy of the touch sensing may be improved.

The dummy line 430 may intersect the touch routing lines 330. For example, the dummy line 430 may include the auxiliary bridges 420. The dummy line 430 may be in direct contact with the connection electrode 450. Thus, in the touch display apparatus according to another embodiment of the present disclosure, the accuracy of the touch sensing may be effectively improved and the luminance deviation due to the voltage drop may be prevented without decreasing the process efficiency.

The second power voltage supply line VSS may be partially separated. For example, the second power voltage supply line VSS may include a separating groove Cg, as shown in FIG. 11. Thus, in the touch display apparatus according to another embodiment of the present disclosure, a noise due to the external signal may be blocked by the second power voltage supply line VSS, and an influence of the signal applied by the second power voltage supply line VSS on the signal applied by the peripheral line, for example, the touch routing lines 330 may be minimized. Therefore, in the touch display apparatus according to another embodiment of the present disclosure, the accuracy for sensing the touch of the user and/or the tool may be improved.

In the result, the touch display apparatus according to the embodiments of the present disclosure may comprise the encapsulating unit covering the light-emitting devices, the touch electrodes on the encapsulating unit, and the auxiliary line crossing between the touch electrodes. The auxiliary line may be electrically connected to the power voltage supply line at the outside of the display area in which the light-emitting device are disposed. The second emission electrode of each light-emitting device may be electrically connected to the auxiliary line in the display area. Thus, in the touch display apparatus according to the embodiments of the present disclosure, the luminance deviation due to the voltage drop may be prevented. Thereby, in the touch display apparatus according to the embodiments of the present disclosure, the quality of the image be improved.

What is claimed is:

1. A touch display apparatus comprising:
a device substrate including a display area and a bezel area disposed outside the display area;
a light-emitting device on the display area, the light-emitting device including a first emission electrode, a light-emitting stack, and a second emission electrode that are sequentially stacked;
a first dam on the bezel area, the first dam surrounding the display area;
an encapsulating layer on the light-emitting device, the encapsulating layer including an organic encapsulating layer in a region defined by the first dam;
a power voltage supply line positioned outside of the first dam, the power voltage supply line extending along an edge of the display area;
a touch sensor on the encapsulating layer, the touch sensor including a plurality of touch electrodes; and
an auxiliary line electrically connected to the power voltage supply line, the auxiliary line extending on the encapsulating layer in the display area and is connected to the second emission electrode in the display area.

2. The touch display apparatus according to claim 1, wherein the power voltage supply line includes a first supply line and a second supply line on the first supply line, the second supply line including a same material as the plurality of touch electrodes.

3. The touch display apparatus according to claim 1, wherein the auxiliary line includes a plurality of auxiliary electrodes between the plurality of touch electrodes, the plurality of auxiliary electrodes including a same material as the plurality of touch electrodes.

4. The touch display apparatus according to claim 3, wherein at least a portion of each of the plurality of auxiliary electrodes are on a same layer as the plurality of touch electrodes.

5. The touch display apparatus according to claim 3, wherein the touch sensor further includes a plurality of touch bridges that electrically connect the plurality of touch electrodes,
wherein the auxiliary line further includes a plurality of auxiliary bridges electrically connecting the plurality of auxiliary electrodes,
wherein the plurality of touch bridges are on the same layer as the plurality of touch electrodes, and the plurality of auxiliary bridges are disposed on a different layer from the plurality of auxiliary electrodes.

6. The touch display apparatus according to claim 5, wherein each of the plurality of auxiliary bridges intersects one of the plurality of touch bridges.

7. The touch display apparatus according to claim 5, further comprising:
a plurality of touch pads on the bezel area, the plurality of touch pads spaced away from the encapsulating layer such that the plurality of touch pads are non-overlapping with the encapsulating layer;
a plurality of touch routing lines extending along a surface of the encapsulating layer, the plurality of touch routing lines electrically connecting a corresponding touch electrode from the plurality of touch electrodes to a corresponding touch pad from the plurality of touch pads; and
a connection electrode between the power voltage supply line and the auxiliary line, and intersecting the plurality of touch routing lines, the connection electrode electrically connecting together the power voltage supply line and the auxiliary line,
wherein the connection electrode is on a different layer from the plurality of touch routing lines.

8. The touch display apparatus according to claim 7, wherein the connection electrode includes a same material as the plurality of auxiliary bridges.

9. The touch display apparatus according to claim 7, wherein each of the plurality of touch routing lines comprises a first routing line including the same material as the plurality of auxiliary bridges, and a second routing line including the same material as the plurality of touch electrodes,
wherein the first routing line is spaced away from the connection electrode, and the second routing line is electrically connected to the first routing line at a location that is non-overlapping with the connection electrode.

10. The touch display apparatus according to claim 7, further comprising:
a dummy line electrically connected to the connection electrode, the dummy line surrounding the display area,
wherein the dummy line includes a same material as the connection electrode.

11. The touch display apparatus according to claim 1, further comprising:
a second dam extending parallel to the first dam,
wherein the auxiliary line is connected to the power voltage supply line at a location that is between the first dam and the second dam.

12. The touch display apparatus according to claim 11, further comprising:
an over-coat layer between the display area and the light-emitting device;
a bank insulating layer on the over-coat layer, the bank insulating layer covering an edge of the first emission electrode; and
an intermediate electrode electrically connected to the power voltage supply line, a portion of the intermediate electrode between the over-coat layer and the bank insulating layer,
wherein the second emission electrode is electrically connected to the intermediate electrode through the bank insulating layer.

13. The touch display apparatus according to claim 1, further comprising:
a bank insulating layer on the display area, the bank insulating layer defining an emission area in which light is emitted; and
a spacer on the bank insulating layer,
wherein the first emission electrode, the light-emitting stack, and the second emission electrode of the light-emitting device are stacked on the emission area defined by the bank insulating layer, and a portion of the second emission electrode is on the spacer and the portion contacts the auxiliary line on the spacer to electrically connect the second emission electrode to the auxiliary line.

14. The touch display apparatus according to claim 13, further comprising:

a conductive pattern on the spacer, the conductive pattern between the portion of second emission electrode and the auxiliary line,
wherein the second emission electrode is electrically connected to the conductive pattern.

15. The touch display apparatus according to claim 13, wherein the auxiliary line overlaps with the bank insulating layer.

16. A touch display apparatus comprising:
a substrate including a display area and a bezel area;
a plurality of pixels each including a light emitting device comprising a first electrode, a light emitting layer on the first electrode, and a second electrode on the light emitting layer, wherein a second electrode of a first pixel from the plurality of pixels is electrically connected to a second electrode of a second pixel from the plurality of pixels, the second pixel closer to the bezel area than the first pixel such that the second electrode of the second pixel extends from the display area to the bezel area;
a power voltage supply line on the bezel area, the power voltage supply line connected to the second electrode of the second pixel to supply a power supply voltage to the second pixel, and the power supply voltage supplied to the second electrode of the first pixel via the second electrode of the second pixel;
a touch sensor on the plurality of pixels, the touch sensor including a plurality of touch electrodes; and
an auxiliary power line on the display area, the auxiliary power line electrically connected to the power supply voltage and connected to the second electrode of the first pixel and the second electrode of the second pixel to supply the power supply voltage to the second electrode of the first pixel and the second electrode of the second pixel.

17. The touch display apparatus according to claim 16, wherein the auxiliary line includes a plurality of auxiliary electrodes between the plurality of touch electrodes, the plurality of auxiliary electrodes including a same material as the plurality of touch electrodes.

18. The touch display apparatus according to claim 17, wherein the plurality of auxiliary electrodes are on a same layer as the plurality of touch electrodes.

19. The touch display apparatus according to claim 17, wherein the touch sensor includes a plurality of touch bridges electrically connecting the plurality of touch electrodes,
wherein the auxiliary line includes a plurality of auxiliary bridges electrically connecting the plurality of auxiliary electrodes,
wherein the plurality of touch bridges are on the same layer as the plurality of touch electrodes, and the plurality of auxiliary bridges are disposed on a different layer from the plurality of auxiliary electrodes.

20. The touch display apparatus according to claim 16, further comprising:
an intermediate connection electrode including a first end that is connected to the power voltage supply line and a second end that is connected to the second electrode of the second pixel.

* * * * *